(12) United States Patent
Smith et al.

(10) Patent No.: US 6,505,317 B1
(45) Date of Patent: Jan. 7, 2003

(54) SYSTEM AND METHOD FOR TESTING SIGNAL INTERCONNECTIONS USING BUILT-IN SELF TEST

(75) Inventors: Brian L. Smith, Sunnyvale, CA (US); James C. Lewis, San Jose, CA (US); David Broniarczyk, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/534,839

(22) Filed: Mar. 24, 2000

(51) Int. Cl.$^7$ ................................................. G06F 11/00
(52) U.S. Cl. ...................................... 714/738; 714/724
(58) Field of Search ................................ 714/738, 733, 714/724

(56) References Cited

U.S. PATENT DOCUMENTS

| | | | |
|---|---|---|---|
| 5,150,047 A | * | 9/1992 | Saito et al. |
| 5,621,741 A | | 4/1997 | Kohiyama |
| 5,809,226 A | | 9/1998 | Baldwin et al. |
| 6,018,810 A | | 1/2000 | Olarig |

OTHER PUBLICATIONS

"jtag–XLi™—The Board–Level Solution; At–Speed Interconnect Test", Logic Vision.
IBM Corp., "Architecture to Facilitate Card Interconnect Self–Test," IBM Technical Disclosure Bulletin, vol. 33, No. 4, Sep. 1990, pp. 331–333.

International Search Report, application No. PCT/US 01/09720, mailed Oct. 17, 2001.

* cited by examiner

Primary Examiner—Phung M. Chung
(74) Attorney, Agent, or Firm—B. Noël Kivlin

(57) ABSTRACT

A system and method for testing signal interconnections using built-in self test (BIST). BIST functionality is designed into the various chips of a computer system. These chips include a transmit unit, a receive unit, a control logic unit, and a central logic unit. A control logic unit associated with a signal block (i.e. a group of signals) configures the signal block for either testing or normal operation. The central logic unit performs test pattern generation for all signal blocks on a given chip. Chips may act as either a master or slave chip during testing. When acting as a master chip, the transmit unit of the chip drives test patterns onto one or more signal lines. The receive unit of the slave chip returns a corresponding test pattern to the master chip after receiving the transmitted test pattern. A receive unit on the master chip receives the corresponding test patterns and performs verification. All tests occur at the operational clock speed of the computer system. A master and a slave chip need not be mounted upon the same circuit board, allowing for tests through connectors within a computer system.

51 Claims, 7 Drawing Sheets

SYSTEM AND METHOD FOR TESTING SIGNAL INTERCONNECTIONS USING BUILT-IN SELF TEST

BACKGROUND OF THE INVENTION

1. Field of the Invention

This invention relates to the testing of electronic equipment, and more specifically, to the testing of interconnections between integrated circuits in a computer system.

2. Description of the Related Art

As dependence on various electronic systems continues to increase, so too does the need for reliability. From a hardware perspective, reliability may be ascertained by testing at various levels. These levels of testing include system tests, printed circuit assembly (i.e. circuit board) tests and integrated circuit tests. Such tests may ensure proper fabrication and assembly of the various components of the system. However, these tests may have limitations.

One such limitation involves testing the interconnections (signal lines) of a printed circuit assembly for an electronic system (such as a computer system) at the operational speed which the system is configured to run. Operational speed may be defined as the clock frequency of a computer system bus. Such interconnections may be tested by various methods including in-circuit test (ICT) or boundary scan. Typically, these types of testing methods are limited to a maximum frequency that is significantly less than the clock frequency of the assembly to be tested. Testing by such methods may allow an assembly with faulty interconnections to pass at maximum tester frequency. These same assemblies may fail when tested at the intended operational clock frequency, or worse, when in an operational environment. Faulty interconnections may be caused by various defects such as cold or insufficient solder joints, damaged signal lines, and damaged connector pins.

Further compounding the problems outlined above is the difficulty in isolating a faulty interconnection that passes a low frequency test, but fails at operational speed. In many situations, such failures may require time-consuming visual inspections and/or the use of other troubleshooting techniques. The time consumed in isolating the fault may add significant cost to a printed circuit assembly. Furthermore, if a particular fault is not diagnosed correctly unnecessary rework and component replacements may occur, further adding to the cost of the assembly.

A partial solution to some of the above problems is to incorporate built-in self test (BIST) into the design of a computer system. With BIST functionality designed into a system, some testing of interconnections may be accomplished. However, the BIST functionality employed in many systems may be limited. For example, many typical BIST systems are "point-to-point", testing signal links strictly from one chip to another at a given time. Such a system using BIST may not be configured to tests multiple links from a single chip simultaneously. Some BIST systems may also test for interconnects at low speeds, which may not be effective in detecting a signal line that is defective when operating at full speed. Furthermore, many BIST systems require a centralized system controller which is used to coordinate tests and configurations for the various chips in the system. Using such a system controller may require the use of valuable printed circuit board space which could otherwise be used to implement other functions.

SUMMARY OF THE INVENTION

The problems outlined above may be in large part solved by a system and method for testing signal interconnections using built-in self test (BIST). In one embodiment, BIST functionality is designed into the various chips of a computer system, which are mounted upon printed circuit boards. Instead of using a single BIST system controller, each chip of the system includes its own central logic unit, which may be used to configure its own various ports for BIST, as well as performing test pattern generation. Chips may also include transmit links and receive links for transmitting and receiving test patterns. In general, a given chip of the system may act as either a master or a slave chip during testing. All chips within the system are configured to allow testing to occur at the operational clock frequency of the computer system. Performing the test at the operational clock frequency may allow the test to ensure good signal integrity on the interconnections between chips. Interconnections tested may include those that pass through connectors as tests may be conducted between two or more chips on different circuit boards within the computer system.

In general, the system and method for testing interconnections using BIST may be implemented in a variety of systems, and is not limited to computers. Such systems may include digital signal processing equipment, telephones and telecommunications equipment, wireless communications equipment, or consumer electronic devices.

Several different methods are contemplated for invoking the BIST. In one embodiment, the BIST is invoked upon the insertion of a hot-pluggable printed circuit board into an operating computer system and may ensure good signal integrity between the various chips of the printed circuit board. The BIST may also ensure good signal integrity between components on the hot-pluggable circuit board and other components of the computer system on other printed circuit boards. Once the BIST successfully completes, communications between the various chips mounted upon the printed circuit board and the computer system may begin. In another embodiment, the BIST may be invoked by a signal from automated test equipment (ATE), such as an in-circuit tester. During manufacturing test, the tester may send a signal to a printed circuit assembly with BIST features. Upon completion of testing, the printed circuit board may return a signal to the tester indicating that testing is complete, along with the results. Other embodiments wherein the BIST is invoked by a power-on reset or initial power-up of a computer system are possible and contemplated as well.

Another embodiment of the BIST system includes the ability to test multiple interconnections from a single master chip. In some embodiments, a single master chip may transmit test patterns simultaneously to a plurality of slave chips sharing a common bus. Prior to the transmission of the test patterns, the master chip may program a sequence at which the slave chips will respond to receiving the test. After receiving the transmitted test pattern from the master chip, each slave chip may then respond by returning a corresponding test pattern to the master chip, in the sequence designated by the master chip. This may prevent bus conflicts when testing interconnections between multiple chips across a common bus.

In other scenarios, a single master chip may transmit test patterns to a plurality of slave chips that do not share a common bus. Test patterns for each slave chip are transmitted through different signal blocks of the master chip with corresponding test patterns received from the slave chips through the same ports. The corresponding test patterns received from each of the slave chips may then be checked by a receive unit within the master chip in order to verify the tested interconnection.

Yet another feature of the BIST system is the ability to characterize operating margins and input/output (I/O) performance. For example, during testing the BIST system may lower logic voltage levels and measure setup time, or raise logic voltage levels and measure hold time. This may allow the determination of worst and best case conditions for signal transfers between chips, and may be especially useful in predicting when certain chips are likely to fail.

Thus, in various embodiments, the system and method for testing interconnections using built in self-test may advantageously allow testing of signal interconnections at operational clock speed. The use of a central logic unit within each master chip may eliminate the need for a single BIST system controller. Implementing transmit and receive links may allow a given chip to act as either a master chip or a slave chip. The ability of the system to allow multiple tests to be conducted simultaneously may allow for shorter test times. Similarly, the ability of the system to allow tests to be conducted between any two properly configured chips of the system may allow the testing of interconnections between two or more chips on different circuit boards.

BRIEF DESCRIPTION OF THE DRAWINGS

Other objects and advantages of the invention will become apparent upon reading the following detailed description and upon reference to the accompanying drawings in which.

Figure 1:
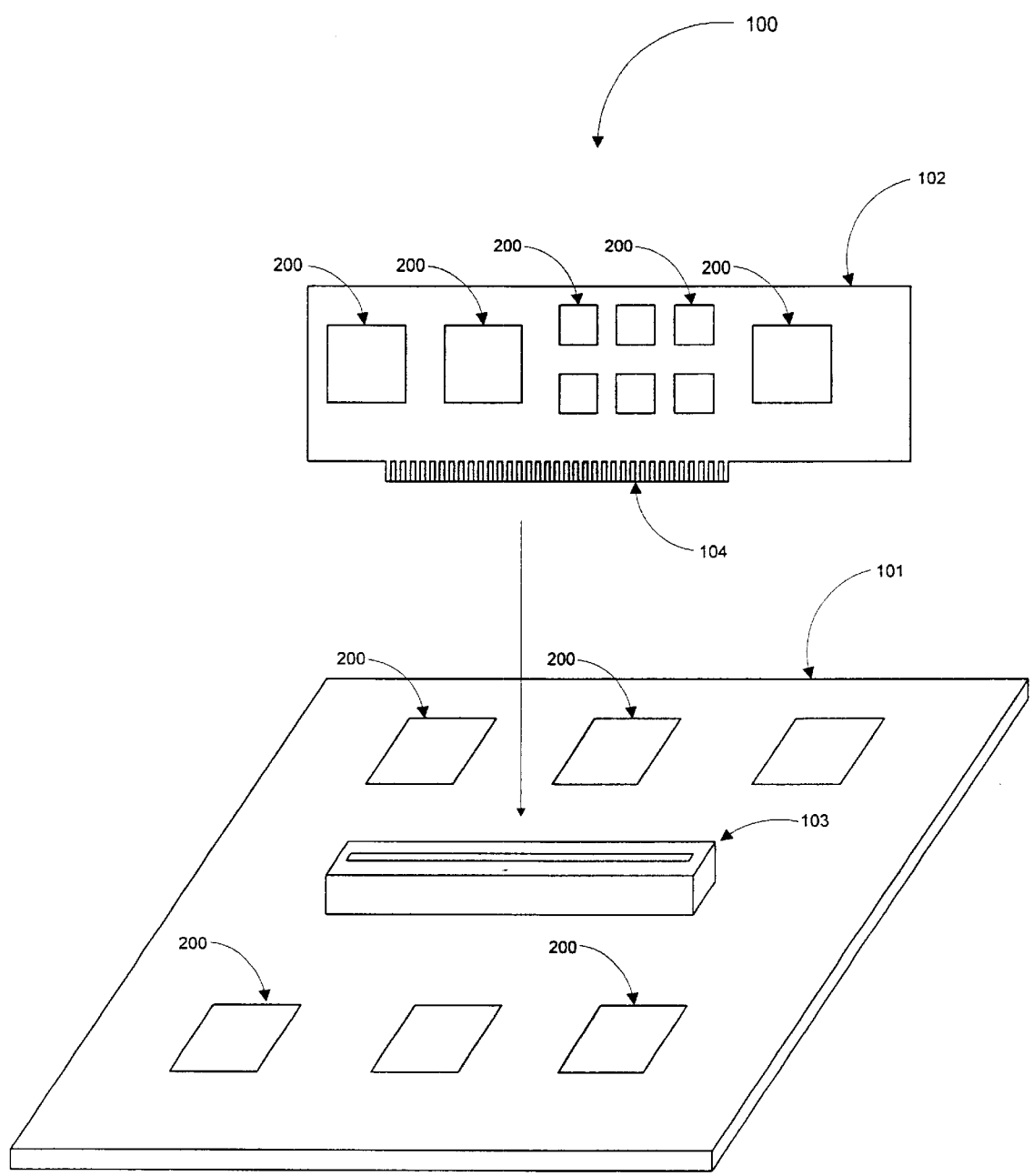
FIG. 1 is a view of one embodiment of a computer system motherboard and daughter board with built-in self-test (BIST) functionality.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Turning now to FIG. 1, a view of one embodiment of a computer system motherboard and daughter board each with built-in self-test (BIST) functionality is illustrated. In general, as used herein, the term "computer system" is not intended to be limiting. Instead, the term may apply to a variety of systems, including desktop computers, laptops, or file servers. Furthermore, the BIST system and method as described herein is not limited to computer systems, but rather may be implemented in a variety of electrical/electronic systems. Such systems may include digital signal processing equipment, telephones and telecommunications equipment, wireless communications equipment, or consumer electronic devices.

Computer system 100 includes both motherboard 101 and daughterboard 102. Daughterboard 102 may be one of several different types of add-in cards to a computer system, such as a modem or network interface card. Daughterboard 102 includes an edge connector 104 that may be inserted into connector slot 103 in order to electrically couple with motherboard 101. Daughterboard 102 may be configured to be "hot-pluggable", allowing it to be inserted into slot 103 when the computer system is powered up without the risk of damage to either board. In some embodiments, testing of interconnections may be initiated in a hot-pluggable circuit board upon insertion into a socket of a computer system under power. This may allow a technician to replace a failing board in a system without interruption of power, as well as providing a convenient and rapid means of testing to ensure the board may communicate properly with the computer system. Initiation of testing may also be accomplished by a global signal (such as a power-on reset) or on initial power-up of a computer system for some embodiments.

Testing may also be performed prior to insertion of the board into a computer system. In various embodiments, a circuit board with BIST functionality may be undergo testing on automated test equipment (ATE) during manufacturing. The ATE may initiate testing by driving a signal to the circuit board. The circuit board may then indicate testing is complete by driving a signal back to the ATE, and may also provide failure information.

Both motherboard 101 and daughterboard 102 include a plurality of master/slave chips 200. Master/slave chips 200 include various functional units for implementing BIST for signal interconnections of computer system 100, as will be discussed further below. Broadly speaking, a master/slave chip 200 may be any type of chip in computer system 100, such as a central processing unit (CPU), memory controller, or application specific integrated circuit (ASIC), with BIST functionality incorporated into its design.

Tests of interconnections may be conducted between any two-master/slave chips 200 of the system regardless of whether they are mounted upon motherboard 101 or daughterboard 102. Tests between master/slave chips 200 mounted upon different circuit boards may be especially useful in verifying the integrity of signal interconnections that must pass through a connector.

Computer system 100 may have both a normal mode of operation, as well as a test mode. Normal mode may be defined as operations for which the device is intended, such as performing word processing on a desktop computer. Test mode refers to operations wherein the BIST system is testing interconnections. Associated with the normal mode of operation is a designated clock speed. This clock speed may be defined as a bus frequency, CPU frequency, or clock speed at which data transfers take place. Tests conducted by the BIST system may be conducted at the designated clock speed used during normal mode. In this manner, testing may ensure good signal integrity for system communications during normal operations.

Figure 2:
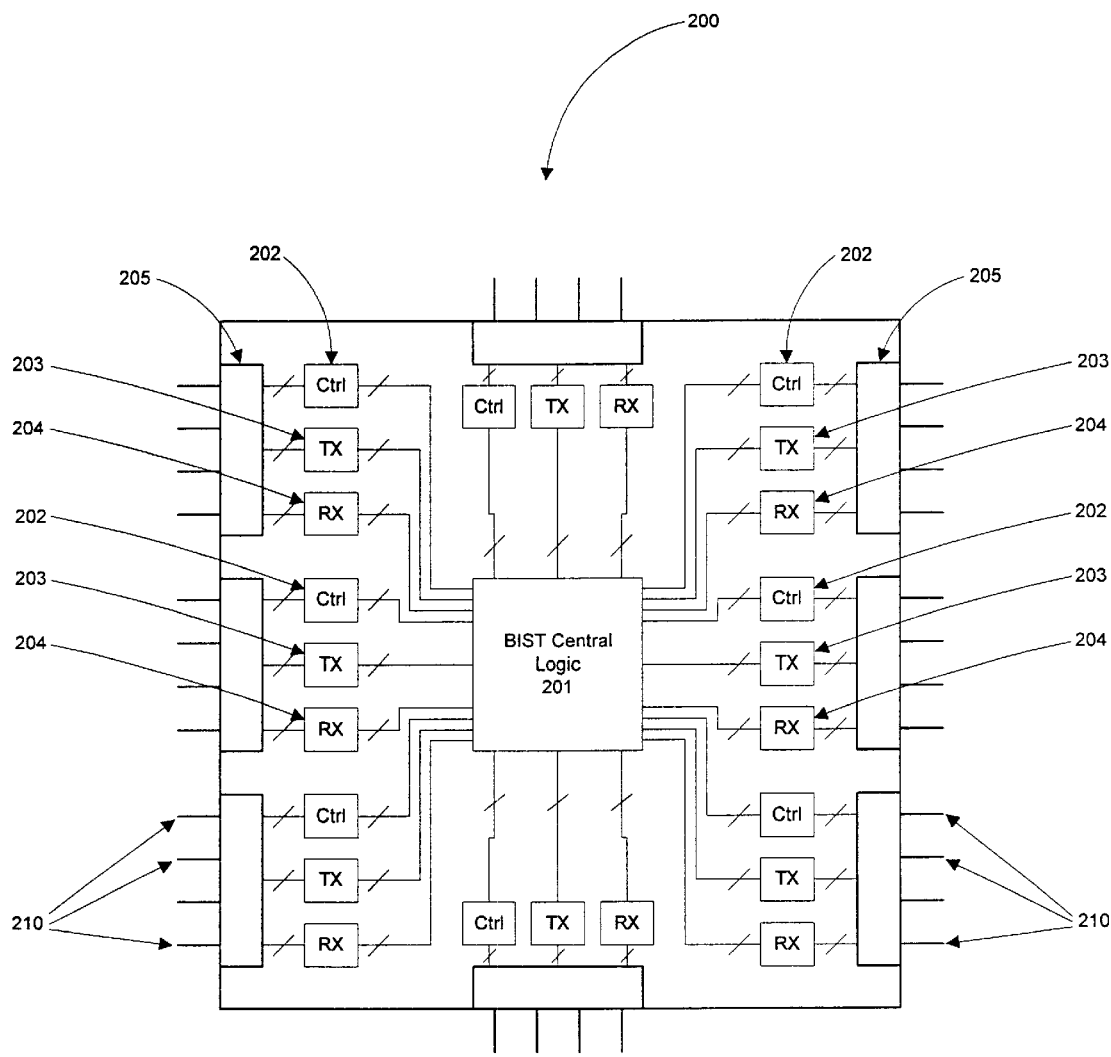
FIG. 2 is a block diagram of one embodiment of a master/slave chip illustrating the arrangement of functional units associated with BIST system.

Moving now to FIG. 2, a block diagram of one embodiment of a master/slave chip 200 illustrating the arrangement of functional units associated with a BIST system is shown. Master/slave chip 200 includes BIST central logic 201, which provides various BIST control functions, including test pattern generation. A plurality of signal blocks 205 is arranged along the periphery of master/slave chip 200. Signal blocks 205 may be thought of as "ports" of a chip, and may connect the chip to the outside world through a plurality of signal pins 210. Associated with each signal block 205 is a control logic unit 202, transmit unit 203, and receive unit 204. Control logic unit 202 may provide various control functions to the signal block, such as configuring the signal block for test or for normal operation. Transmit unit 203 is configured to drive test patterns through the signal block and onto associated system interconnections. Receive unit 204 is configured to receive test patterns and transmit corresponding test patterns back in response thereto. In some embodiments, receive unit 204 may also include pattern checking functions to determine whether a tested interconnection has successfully passed test. Other embodiments may perform pattern checking functions within central logic unit 201. Some embodiments of receive unit 204 may also include one or more registers for temporary storage of received test patterns. The BIST system may also utilize input and output registers associated with a port for temporary pattern storage in other embodiments.

In general, master/slave chip 200 acts as a master chip when configured to generate and transmit test patterns, and acts as a slave chip when configured to receive test patterns and transmit corresponding test patterns back to the originating master. When acting as a master chip, a transmit unit 203 may transmit the test pattern, while a receive unit 204 associated with the same signal block may receive the corresponding test pattern returned from the slave. When acting as a slave, receive unit 203 may be configured to receive test patterns from a master and respond by transmitting a corresponding test pattern back to the master chip. Receive unit 203 may also forward received test patterns to central logic unit 201 for pattern checking when a given test is unidirectional (as will be explained in further detail below). The corresponding test pattern may simply be an inverse of the transmitted test pattern in some embodiments.

Figure 3:
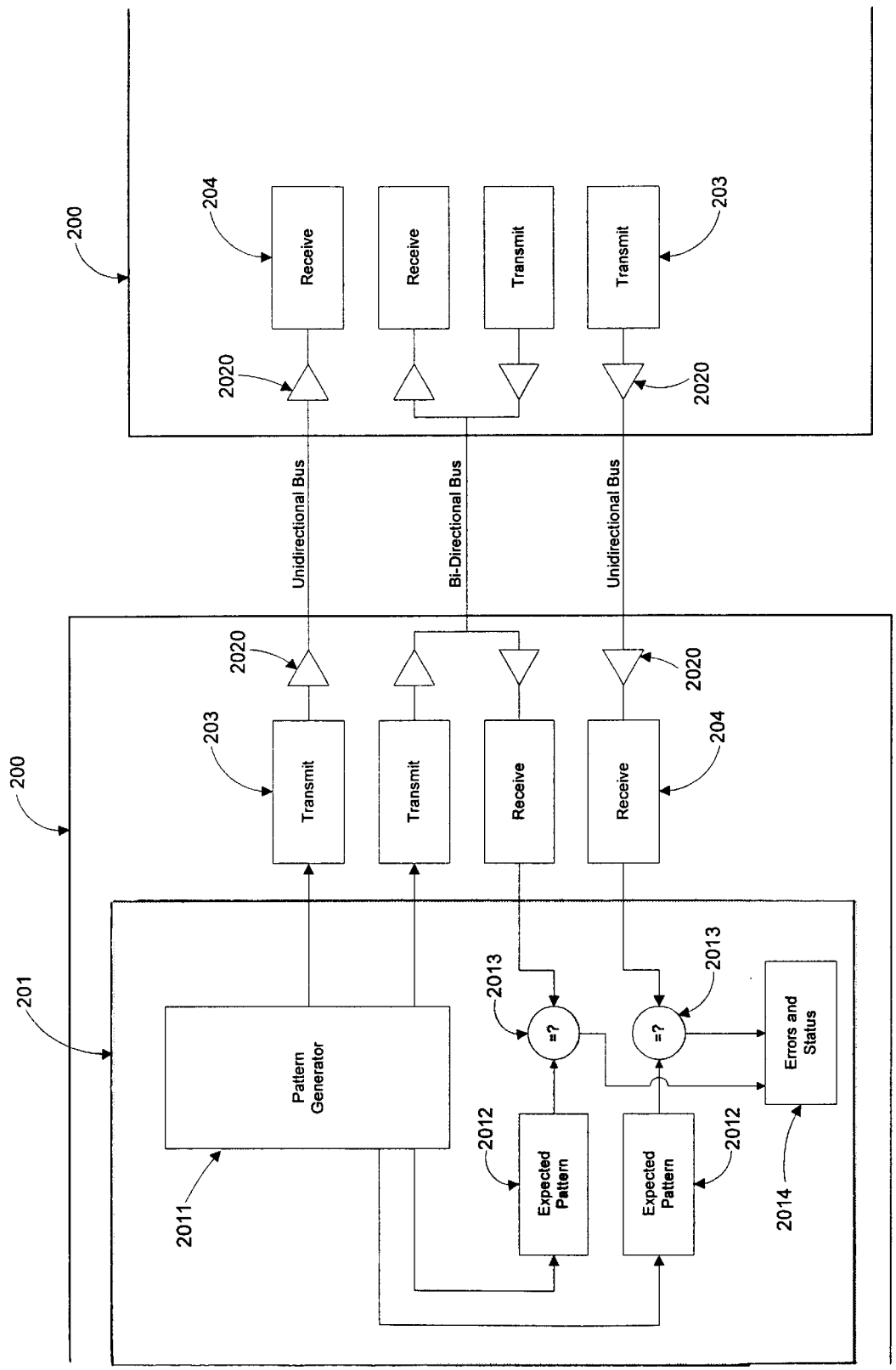
FIG. 3 is a block diagram of one embodiment of a central logic unit of the master/slave chip of FIG. 2.

Turning now to FIG. 3, a block diagram illustrating one embodiment of a central logic unit of the master/slave chip of FIG. 2 is shown. Central logic unit 201 in the embodiment shown includes pattern generator 2011, a plurality of comparators 2013, a plurality of pattern memories 2012, and an error status memory 2014. In this embodiment, pattern generator 2011 is coupled to two transmit units 203, while each of the two comparators 2013 shown is coupled to a receive unit 204. Drivers 2020 are coupled to both the transmit and receive units, although such drivers may not be present or required in some embodiments. Central logic unit is contained within a master/slave chip 200.

Pattern generator 2011 is configured to generate test patterns used in the testing of interconnections to its associated master/slave chip 200. Pattern generator 2011 may drive a test pattern to a transmit unit 203 following the generation of the test pattern. Pattern generator 2011 may also drive test patterns and/or pattern information to pattern memories 2012. Each pattern memory 2012 may store one or more test patterns received from pattern generator 2011. In an alternate embodiment, a pattern memory 2012 may store information about a test pattern which allows its reconstruction. Each pattern memory is coupled to a comparator 2013. A test pattern received by a receive unit 204 may then be forwarded to comparator 2013 to be compared with the expected pattern stored in an associated pattern memory 2012. Thus, comparator 2013 may determine the pass/fail status of a given test. In some embodiments, comparator 2013 may also determine more detailed information such as the location of a failure (i.e. the particular interconnection), timing information, signal level information, or other information.

In the drawing shown master/slave chip 200 is coupled to a second master/slave chip 200. The first chip may act as a master or as a slave, and may conduct tests on both unidirectional and bi-directional buses. When acting as a master and testing an interconnect on a unidirectional bus, a chip may transmit a test pattern across the bus to a slave chip. Similarly, if acting as a slave chip, the chip may received the transmitted test pattern. Once the test pattern is received by the slave, it may then be compared with an expected test pattern to determine test results. When testing is conducted on a bi-directional bus, test results may be determined on either the master or the slave chip. In one embodiment, a master chip may transfer a test pattern to a slave chip, which may respond by transmitting a corresponding test pattern back to the master chip. The master chip may then check the test pattern against an expected result. Testing on a bi-directional bus may also be conducted in the same manner as that of a unidirectional bus. Furthermore, some embodiments may conduct pattern checking at both the master and slave chip during testing on a bi-directional bus.

It should be noted that while the testing described above pertains to buses, the same type of testing may be conducted on any single signal line of the BIST system.

Figure 4:
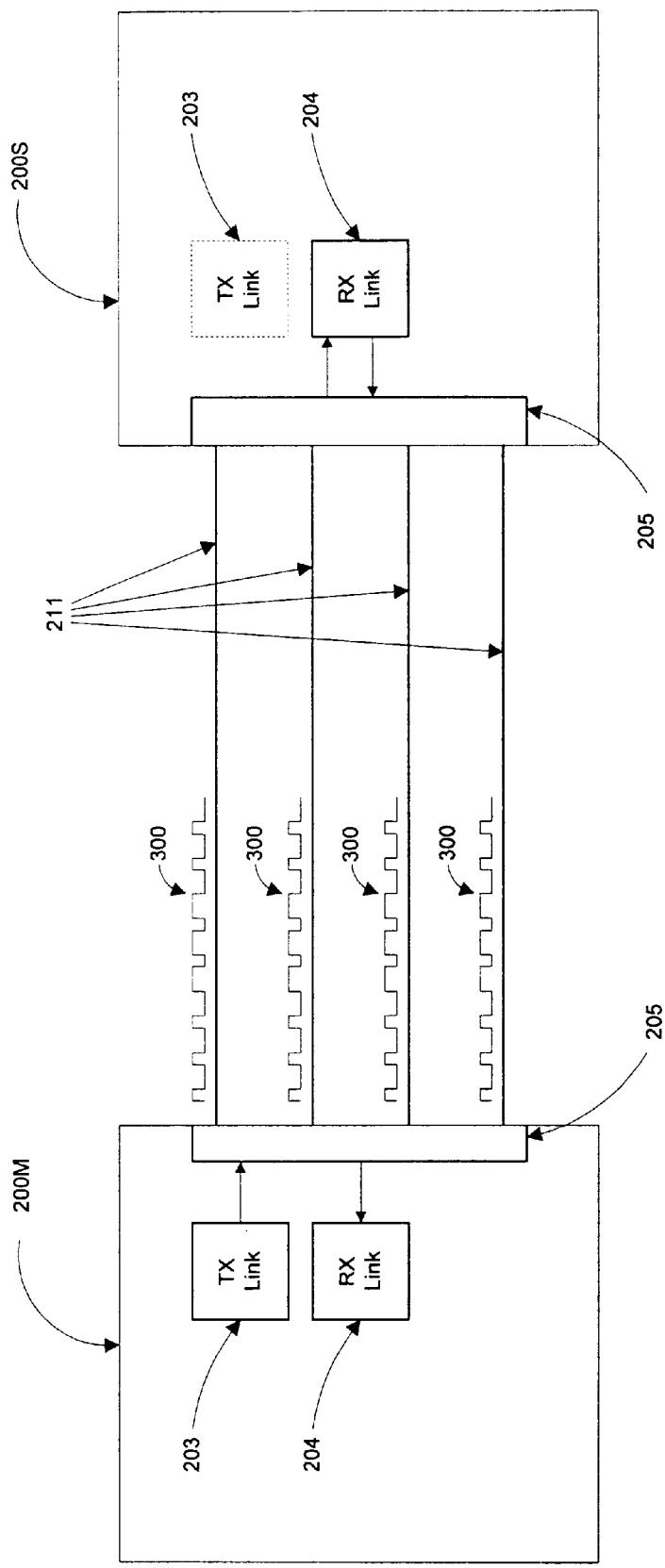
FIG. 4 is a block diagram illustrating the testing of interconnections between two chips of one embodiment of the BIST system.

Moving now to FIG. 4, a block diagram illustrating the testing of signal interconnections between two chips of one embodiment of the BIST system is shown. Transmit unit 203 has been activated by central logic unit 201 of master chip 200M for a given signal block 205. Once activated, transmit unit 203 of master chip 200M may drive test patterns 300 onto signal lines 211 and to signal block 205 of slave chip 200S. In the case depicted in the drawing, signal blocks 205 of master chip 200M and slave chip 200S include four signals. Receive unit 204 of slave chip 200S is configured to receive test patterns 300, and in response, may drive corresponding test patterns back to master chip 200M. Receive unit 204 of master chip 200M may then receive these corresponding test patterns. Once received, the corresponding test patterns may then be compared to the originally transmitted test patterns to determine if a fault exists for one or more of the tested interconnections.

In general, each test pattern consists of a plurality of data bits and includes a number of transitions between a logic-high voltage and a logic-low voltage. Test patterns may be serially transmitted across a single interconnection. When a plurality of interconnections is to be tested, test patterns including a plurality of transitions between a logic-high and a logic-low may be transmitted in parallel.

In some embodiments, the BIST system may be able to characterize I/O performance and operating margins. For example, the BIST system may lower logic voltage levels for signal transmissions prior to a test, and subsequently measure setup times. Similarly, the BIST system may raise logic voltage levels for signal transmissions, and subsequently measure hold times. This may allow the determination of best and worst case conditions for signal transmissions between two chips. In many cases, these best and worst case conditions may change over time. Tracking these conditions over time may provide an indication of which chips are likely to fail.

In various embodiments, a fault may be detected on a given signal line using different methods. One method of detecting faults involves comparison of the corresponding test patterns received by the master chip with those that were initially transmitted. When test patterns are transmitted, they may also be forwarded to the pattern memories of the master chip where they may be stored for comparison with the corresponding test patterns to be received from the slave chip. If the test is unidirectional, a pattern memory in the slave chip may store the expected pattern. The transmitted test patterns stored for comparison may be altered to match the expected corresponding test pattern to be received (e.g. if the corresponding test pattern is an inversion of the transmitted test pattern). Comparisons may be done on a group basis (test patterns received from a group of signal lines are compared as a whole), or by individual signal lines. Since each pattern includes a plurality of transitions between a logic-low voltage and a logic-high voltage, a fault may be detected on a signal line when these transitions do not occur, as the expected pattern will not match the received pattern.

Figure 5A:
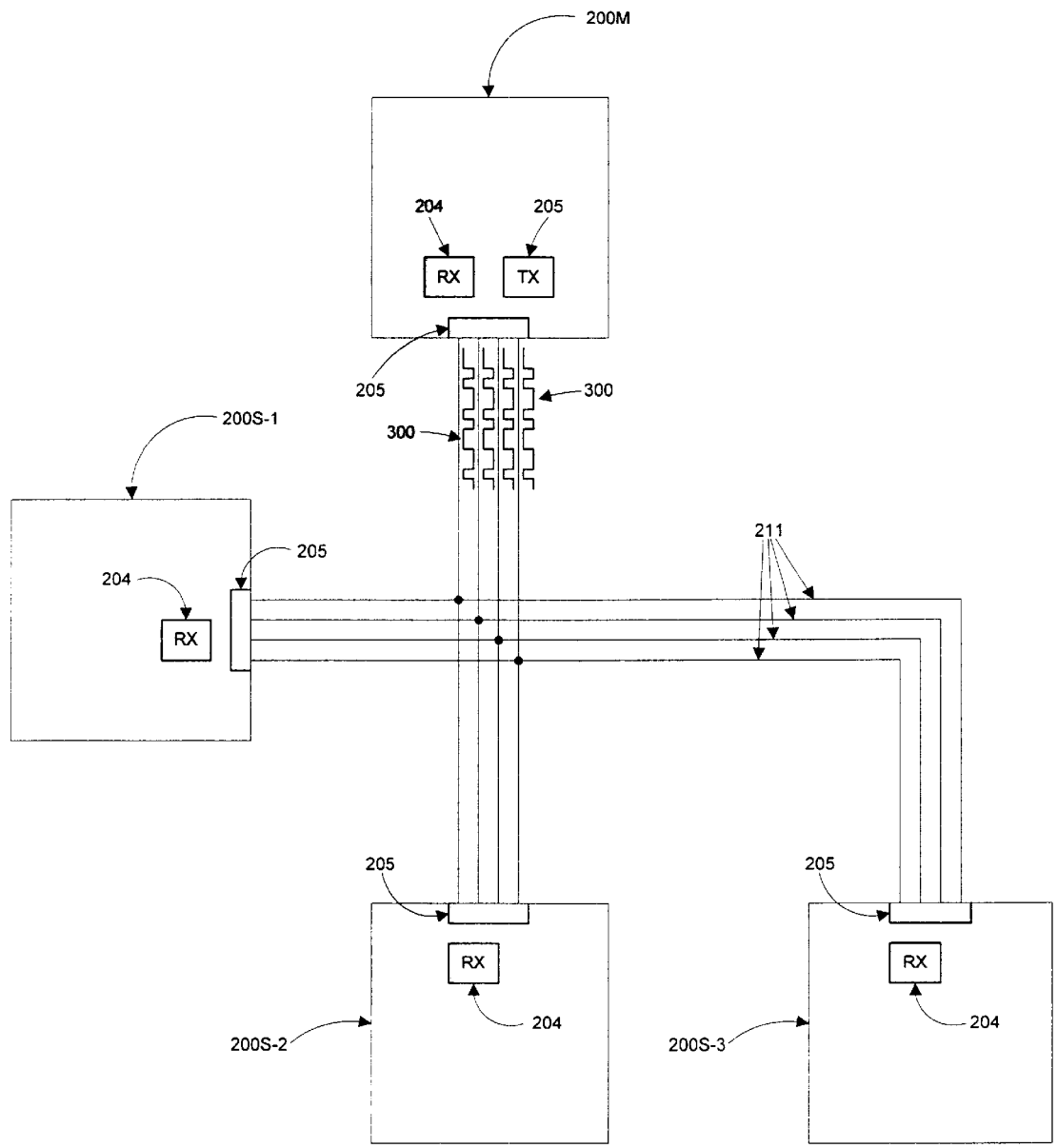
FIG. 5A is a block diagram illustrating the testing between a master chip and multiple slave chips sharing a common bus for one embodiment of the BIST system.

FIG. 5A is a block diagram illustrating the testing between a master chip and multiple slave chips sharing a common bus for one embodiment of a BIST system. In the drawing, master chip 200M has simultaneously transmitted test patterns 300 to three different slave chips (200S-1, 200S-2, and 200S-3) which share a common bus. A receive unit 204 within each slave chip is configured to return corresponding test patterns at a designated time after receiving the transmitted test patterns 300. Prior to transmitting test patterns 300, master chip 200M may program a sequence for the different slave chips to respond to transmitted test patterns 300. For example, master chip 200M may instruct slave chip 200S-1 to respond first, slave chip 200S-2 to respond second, and slave chip 200S-3 to respond third. By instructing the each slave chip to respond at a different time with respect to the other slave chips, bus conflicts may be prevented. Furthermore, master chip 200M may create a number of arbitrary test sequences with the various slave chips on the bus. Such arbitrary sequences may allow testing under conditions not unlike those encountered during normal operations.

Figure 5B:
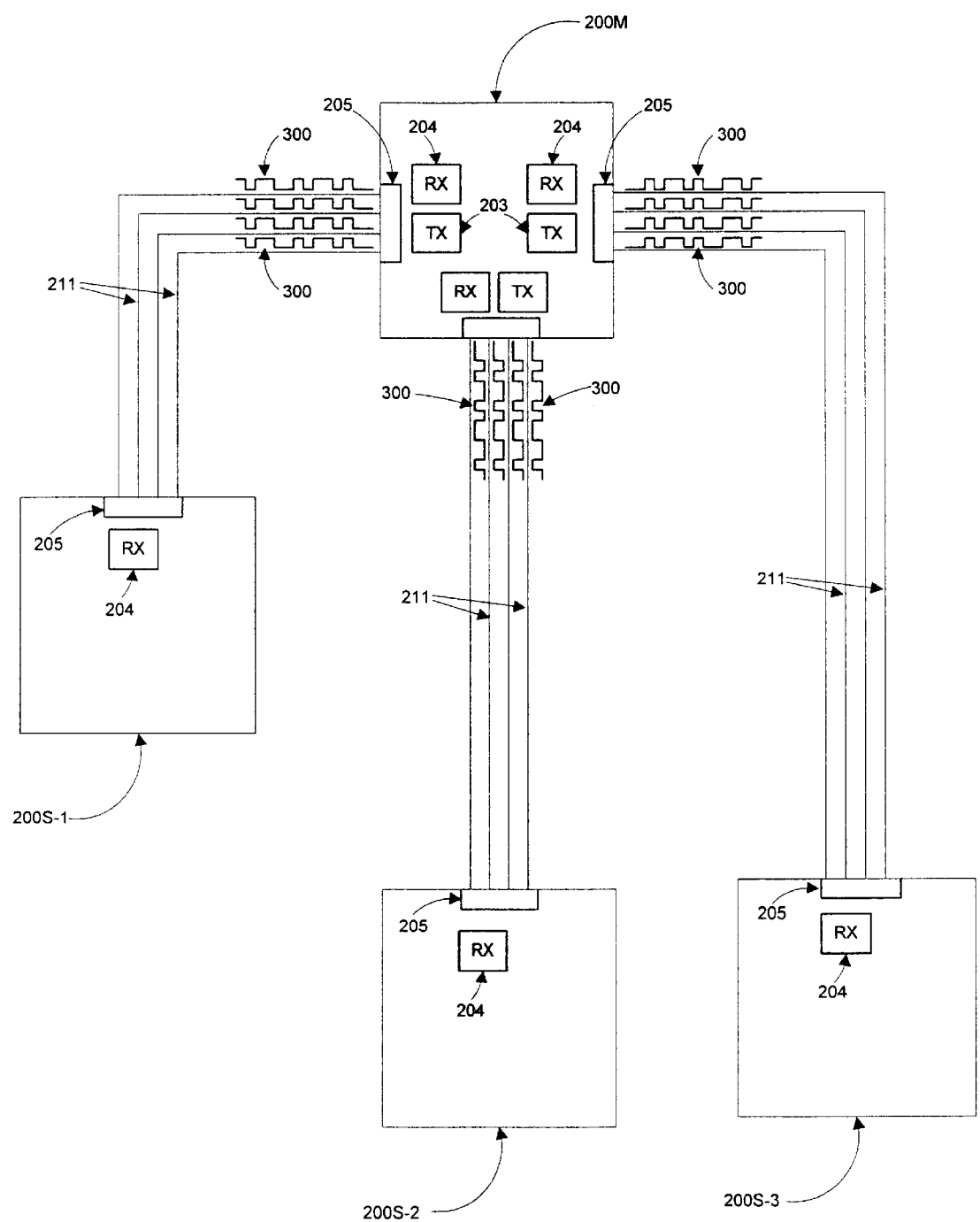
FIG. 5B is a block diagram illustrating the testing between a master chip and multiple slave chips that do not share a common bus for one embodiment of the BIST system.

FIG. 5B is a block diagram illustrating the testing between a master chip and multiple slave chips that do not share a common bus for one embodiment of the BIST system. Master chip 200M may simultaneously transmit test patterns 300 to a plurality of slave chips 200S. Slave chips 200S-1, 200S-2, and 200S-3 are each coupled to master chip 200M through different buses. Since the slave chips do not share a common bus, master chip 300M may drive test patterns to each of them through different signal blocks 205. Corresponding test patterns returned by the slave chips may be received through these different signal blocks and verified immediately by their associated receive units 204. The ability of a single master chip to drive test patterns to multiple slave chips may advantageously allow rapid testing of a large number of interconnections.

Figure 6:
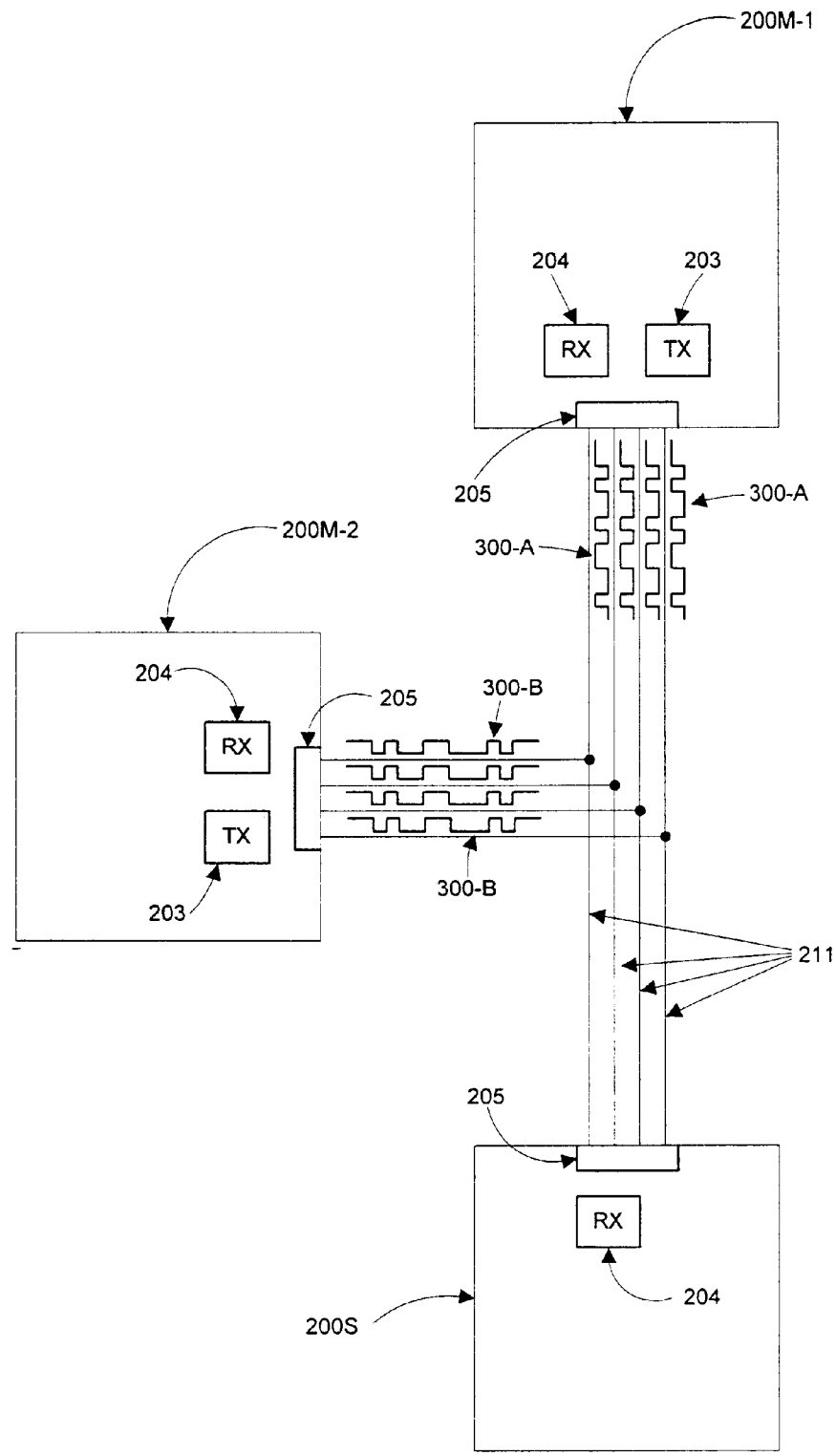
FIG. 6 is a block diagram illustrating back-to-back testing between two master chips and a single slave chip on a high-speed bus.

FIG. 6 is a block diagram illustrating back-to-back testing between two master chips and a single slave chip on a high-speed bus. In some cases, a bi-directional bus may require an idle cycle between one chip driving signals onto the bus and another chip driving signals on the same bus. In other cases, signals may be driven onto the bus by one chip immediately after another chip has driven signals, which may be a more difficult case to test. Many chips associated with a high-speed bus may include an input register and an output register associated with a receive unit and a transmit unit, respectively. In the embodiment shown in FIG. 6, these registers are included within their respective receive units. In some cases of high speed testing, a transmitted pattern may be first stored in an input register of a slave chip before comparison or transmitting it back to the originating master chip. Sampling the test pattern into the input register may consume a bus cycle, while analyzing the test pattern may consume a second bus cycle. This may result in an idle bus cycle between the transmission of a pattern from a first master chip and the transmission of a pattern from a second master chip.

To overcome the problem of idle bus cycles, and thus ensure that a high-speed bus is capable of back-to-back transfers, a scheme such as that illustrated in FIG. 6 may be used. In FIG. 6, two master chips (200M-1 and 200M-2) are testing a high-speed bus interface with slave chip 200S. Master chip 200M-1 may begin the testing by transmitting test patterns 300-A onto signal lines 211 of the high-speed bus. Master chip 200M-1 may then immediately follow by transmitting more test patterns on the subsequent bus cycle. Master chip 200M-2 may then transmit test patterns 300-B in the bus cycle immediately following the second transmission by master chip 200M-1. Master chip 200M-2 may then transmit more test patterns during the bus cycle immediately following its first transmission. Pattern checking may be performed by the master chip from which a given test pattern originated. Immediately following the second transmission by master chip 200M-2, slave chip 200S may return a corresponding test pattern to master chip 200M-1 for pattern checking. In the next bus cycle, slave chip 200S may return a corresponding test pattern to master chip 200M-2 for pattern checking. By allowing each master chip to transmit test patterns twice, idle bus cycles may be avoided when sampling a received test pattern into an input register of the slave chip. By pipelining the transfers of test patterns, the bus may be fully utilized on each bus cycle of the test, and may ensure that back-to-back transfers may occur on a high-speed bus.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system comprising:
   a master chip;
   a slave chip coupled to said master chip;
   wherein during a normal mode of operation data is transferred from said master chip at a designated clock speed;
   wherein said master chip is configured to drive a first test pattern to a port of said slave chip at said designated clock speed and receive a second test pattern from said port of said slave chip at said designated clock speed, said second test pattern corresponding to said first test pattern and transmitted in response to receiving said first test pattern; and,
   wherein said master chip is configured to determine if any errors are present in said second test pattern.

2. The system as recited in claim 1, wherein said second test pattern is a logical inversion of said first test pattern.

3. The system as recited in claim 1, wherein said master chip is configured to simultaneously drive a plurality of first test patterns to a plurality of slave chips.

4. The system as recited in claim 3, wherein said master chip is configured to simultaneously receive a plurality of second test patterns from said plurality of slave chips.

5. The system as recited in claim 1, wherein said master chip and said slave chip are mounted upon a printed circuit board.

6. The system as recited in claim 5, wherein said printed circuit board is hot-pluggable.

7. The system as recited in claim 6, wherein said master chip is configured to drive first test pattern in response to a hot-plug of said printed circuit board into said computer system.

8. The system as recited in claim 7, wherein said master chip is configured to drive first test pattern in response to a signal from automated test equipment (ATE).

9. The system as recited in claim 1, wherein said first test pattern and said second test pattern include a plurality of bits.

10. The system as recited in claim 9, wherein said bits of said first test pattern and said second test pattern are transmitted in parallel across a plurality of signal lines.

11. The system as recited in claim 1, wherein said master chip includes a central logic unit.

12. The system as recited in claim 11, wherein said central logic unit coordinates generation of said test pattern.

13. The system as recited in claim 1, wherein said master chip is configured to drive said test pattern in response to a global signal.

14. The system as recited in claim 13, wherein said master chip is configured to drive said first test pattern in response to a power-on reset.

15. The system as recited in claim 1, wherein said master chip is configured to drive said first test pattern upon initial power-up of said computer system.

16. The system as recited in claim 1, wherein each said first test pattern and said second test pattern include a plurality of transitions between a logic high voltage and a logic low voltage.

17. The system as recited in claim 16, wherein said master chip is configured to detect a fault on a signal line coupling said master chip to said slave chip when one or more of said transitions do not occur.

18. The system as recited in claim 16, wherein said master chip is configured to reduce said logic high voltage prior to transmitting a test pattern.

19. The system as recited in claim 18, wherein said master chip is configured to measure setup time.

20. The system as recited in claim 16, wherein said master chip is configured to increase said logic high voltage prior to transmitting a test pattern.

21. The system as recited in claim 20, wherein said master chip is configured to measure hold time.

22. The system as recited in claim 1, wherein said master chip and said slave chip are configured for testing on a high speed bus.

23. The system as recited in claim 22, wherein said master chip and said slave chip are configured for back-to-back transfers.

24. A method of testing signal interconnections of a system, said method comprising:
   driving a first test pattern from a first chip to a port of a second chip, said first chip electrically coupled to said second chip;
   driving a second test pattern from said second chip to said first chip, said second test pattern driven by said second chip in response to said second chip receiving said first test pattern;
   receiving said second test pattern at said first chip;
   determining if said second test pattern is in error;
   wherein during a normal mode of operation, data is transferred from said first chip at a designated clock speed; and
   wherein driving of said first and said second test patterns and said receiving of said first and said second test patterns occurs at said designated clock speed.

25. The method as recited in claim 24, wherein said first test pattern and said second test pattern include a plurality of transitions between a logic high voltage and a logic low voltage.

26. The method as recited in claim 25, wherein a fault is detected on a signal line coupling said first chip to said second chip when said transitions do not occur.

27. The method as recited in claim 25, wherein individual data bits of said plurality of data bits are masked during a transmission of said first test pattern and said second test pattern.

28. The method as recited in claim 27, wherein said first chip is configured to simultaneously drive a plurality of test patterns to a plurality of second chips.

29. The method as recited in claim 28, wherein said first chip is configured to simultaneously receive a plurality of test patterns from said plurality of second chips.

30. The method as recited in claim 29, wherein said testing is invoked by a signal from automated test equipment.

31. The method as recited in claim 28, wherein said first chip is configured to program a sequence for each of said second chips to drive said second test patterns to said first chip.

32. The method as recited in claim 31, wherein each of said second chips is configured to drive said second test patterns in said sequence programmed by said first chip.

33. The method as recited in claim 25 wherein said first chip and said second chip are mounted upon a printed circuit board.

34. The method as recited in claim 33, wherein said testing is invoked by a hot-plug of said printed circuit board into said computer system.

35. The method as recited in claim 25, further comprising reducing said logic high voltage prior to transmission of a test pattern, and measuring setup time.

36. The method as recited in claim 25, further comprising increasing said logic high voltage prior to transmission of a test pattern, and measuring hold time.

37. The method as recited in claim 24, wherein said first test pattern and said second test pattern include a plurality of data bits.

38. The method as recited in claim 24, wherein said testing is invoked by a global signal.

39. The method as recited in claim 38, wherein said testing is invoked by a power-on reset of said computer system in which said printed circuit assembly is inserted.

40. The method as recited in claim 38, wherein said testing is invoked by initial power-up of said computer system.

41. An integrated circuit configured for built-in self test (BIST) of interconnections in a computer system, said integrated circuit comprising:
   a central logic unit configured to generate test patterns;
   at least one transmit unit coupled to said central logic unit, said transmit unit configured to receive generated test patterns from said central logic unit and transmit said generated test patterns across one or more signal lines to one or more slave chips;
   at least one receive unit coupled to said central logic unit, said receive unit configured to receive one or more returned test patterns from one or more slave chips and transmit said returned test patterns to said central logic unit, said returned test patterns corresponding to said generated test patterns; and, at least one control logic unit coupled to said central logic unit, said control logic configured to drive control signals to a signal block.

42. The integrated circuit as recited in claim 41, wherein each of said transmit units, receive units, and control logic units are associated with a signal block, each of said signal blocks including one or more signal connections each corresponding to a bit of data.

43. The integrated circuit as recited in claim 41, wherein said integrated circuit is mounted upon a printed circuit board adapted for insertion into a computer system.

44. The integrated circuit as recited in claim 43, wherein said computer system includes a normal mode of operation and a test mode of operation, said normal mode of operation having a designated clock speed.

45. The integrated circuit as recited in claim 44, wherein said integrated circuit is configured to transmit test patterns and receive test patterns at said designated clock speed.

46. The integrated circuit as recited in claim 41, wherein each of said generated test patterns and said returned test patterns include a plurality of transitions between a logic high voltage and a logic low voltage.

47. The integrated circuit as recited in claim 46, wherein said integrated circuit is configured to detect a fault on an interconnection when said transitions do not occur.

48. The integrated circuit as recited in claim 46, wherein said integrated circuit is configured to reduce said logic high voltage prior to transmitting a test pattern.

49. The integrated circuit as recited in claim 48, wherein said integrated circuit is configured to measure setup time.

50. The integrated circuit as recited in claim 49, wherein said integrated circuit is configured to increase said logic high voltage prior to transmitting a test pattern.

51. The integrated circuit as recited in claim 50, wherein said integrated circuit is configured to measure hold time.

* * * * *